(12) United States Patent
Fuchs

(10) Patent No.: US 9,021,898 B2
(45) Date of Patent: May 5, 2015

(54) MICROELECTROMECHANICAL SENSOR FOR MEASURING A FORCE, AND CORRESPONDING METHOD

(75) Inventor: Tino Fuchs, Tuebingen (DE)

(73) Assignee: Robert Bosch GmbH, Stuttgart, DE (US)

( * ) Notice: Subject to any disclaimer, the term of this patent is extended or adjusted under 35 U.S.C. 154(b) by 32 days.

(21) Appl. No.: 13/882,767

(22) PCT Filed: Sep. 21, 2011

(86) PCT No.: PCT/EP2011/066393
§ 371 (c)(1),
(2), (4) Date: Aug. 22, 2013

(87) PCT Pub. No.: WO2012/059266
PCT Pub. Date: May 10, 2012

(65) Prior Publication Data
US 2013/0319138 A1  Dec. 5, 2013

(30) Foreign Application Priority Data

Nov. 3, 2010 (DE) .......................... 10 2010 043 277

(51) Int. Cl.
| | |
|---|---|
| *G01L 1/10* | (2006.01) |
| *G01L 1/04* | (2006.01) |
| *G01L 1/00* | (2006.01) |
| *B81B 3/00* | (2006.01) |
| *G01L 7/08* | (2006.01) |
| *G01L 9/00* | (2006.01) |
| *G01P 15/12* | (2006.01) |
| *B81C 1/00* | (2006.01) |

(52) U.S. Cl.
CPC .............. *B81B 3/0018* (2013.01); *G01L 1/005* (2013.01); *G01L 7/082* (2013.01); *G01L 9/0041* (2013.01); *G01P 15/12* (2013.01); *B81C 1/00023* (2013.01); *G01L 1/00* (2013.01)

(58) Field of Classification Search
USPC ..................................................... 73/862.625
See application file for complete search history.

(56) References Cited

U.S. PATENT DOCUMENTS 3,325,733 A * 6/1967 Lemelson ................. 324/103 R
3,447,045 A * 5/1969 Hickmott ........................ 257/30
(Continued)

FOREIGN PATENT DOCUMENTS

CN          100478665 C    4/2009
DE     10 2008 033 592 A1   2/2010
(Continued)

OTHER PUBLICATIONS

International Search Report corresponding to PCT Application No. PCT/EP2011/066393, mailed Mar. 19, 2012 (German and English language document) (7 pages).

*Primary Examiner* — Lisa Caputo
*Assistant Examiner* — Jamel Williams
(74) *Attorney, Agent, or Firm* — Maginot, Moore & Beck LLP

(57) ABSTRACT

A microelectromechanical sensor is configured to measure a force, a pressure, or the like. The sensor includes a substrate and a measuring element. The measuring element includes at least two electrically conductive regions, and at least one of the electrically conductive regions is at least partly connected to the substrate. The sensor also includes at least one changing region, and the changing region lies at least partly between the electrically conductive regions. The changing region is configured in a substantially electrically insulating manner in an unloaded state and in a substantially electrically conductive manner in a loaded state.

6 Claims, 5 Drawing Sheets

(56) References Cited

U.S. PATENT DOCUMENTS 5,202,605 A 4/1993 Kaneko et al.
2005/0103124 A1* 5/2005 Asai et al. ................ 73/862.046
2006/0220781 A1* 10/2006 Kuwashima et al. ....... 338/32 R

FOREIGN PATENT DOCUMENTS

| | | |
|---|---|---|
| JP | 2002-148132 A | 5/2002 |
| JP | 2003-37312 A | 2/2003 |

* cited by examiner a)

b)

a)

b)

a)

b)

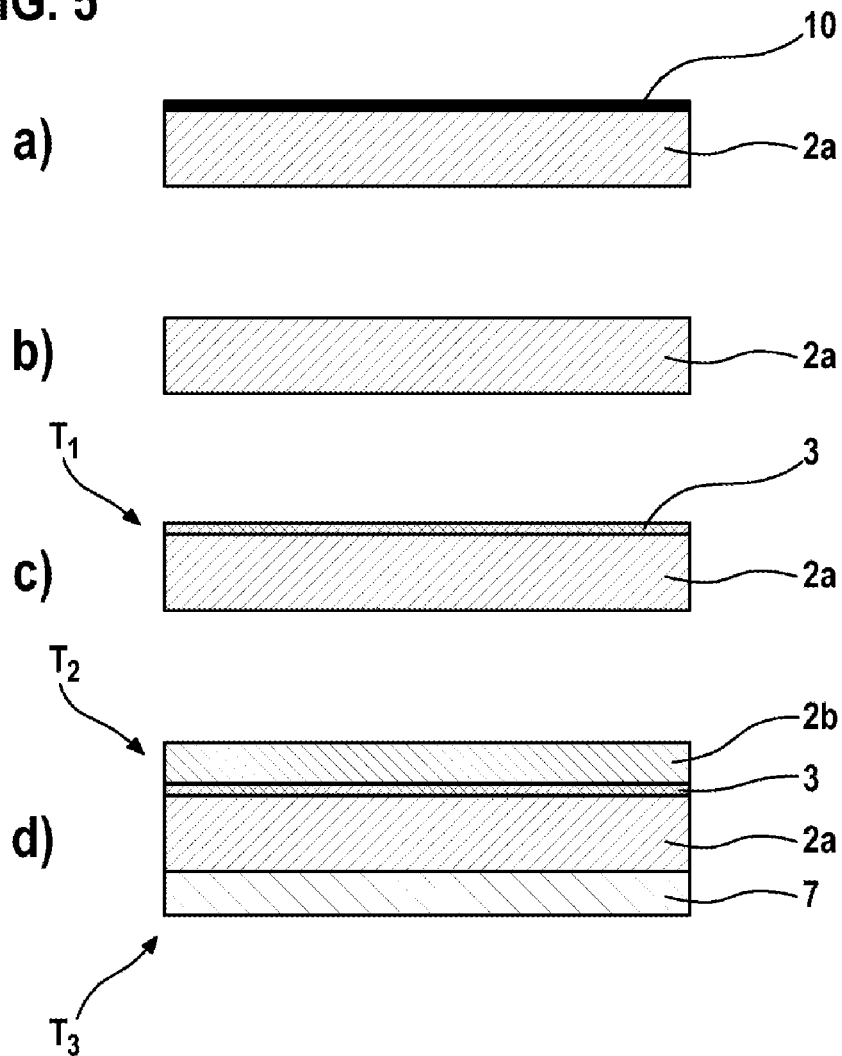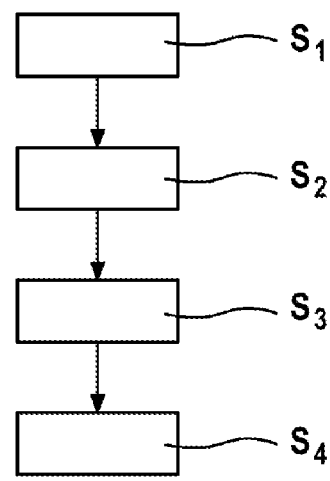

MICROELECTROMECHANICAL SENSOR FOR MEASURING A FORCE, AND CORRESPONDING METHOD

This application is a 35 U.S.C. §371 National Stage Application of PCT/EP2011/066393, filed on Sep. 21, 2011, which claims the benefit of priority to Serial No. DE 10 2010 043 277.6, filed on Nov. 3, 2010 in Germany, the disclosures of which are incorporated herein by reference in their entirety.

The disclosure relates to a microelectromechanical sensor for measuring a force, a pressure or the like, to a corresponding method and to a corresponding production method.

BACKGROUND

Microelectromechanical systems have gained great economic importance in the meantime. The majority is formed here by microelectromechanical sensors which are used, in particular, in the consumer sector and in the automotive sector as acceleration and pressure sensors.

Such pressure sensors are based on substantially the same functional principle: a pressure difference results in deformation of a diaphragm in the pressure sensor. This deformation of the diaphragm, which is proportional to the pressure difference, is measured. In this respect, two corresponding methods for the evaluation are already known:

In the capacitive method, the diaphragm is configured in such a manner that a capacitance changes as a result of the diaphragm deformation. The corresponding capacitance change is recorded and this capacitance change is then used to calculate the pressure difference or the corresponding pressure.

The second evaluation method is based on the so-called piezoresistive effect. Piezoresistors are arranged on or in the corresponding diaphragm. A voltage is then applied to the piezoresistors. If the diaphragm is deformed, the electrical resistance of the piezoresistors is also changed thereby, that is to say the diaphragm deformation is measured as the resistance change. A pressure sensor based on the piezoresistive effect is disclosed, for example, in DE 10 2008 033 592 A1.

SUMMARY

The microelectromechanical sensor for measuring a force, a pressure or the like, as defined in the description below, comprises a substrate with a measuring element, the measuring element comprising at least two electrically conductive regions, at least one of the electrically conductive regions being at least partially connected to the substrate, and at least one changing region, the changing region being at least partially arranged between the electrically conductive regions, the changing region being substantially electrically insulating in an unloaded state and being substantially electrically conductive in the loaded state.

The method for measuring a force, a pressure or the like, in particular suitable for being carried out with a microelectromechanical sensor as described herein, comprises the steps of
measuring an electrical variable which is applied to a changing region in the unloaded state, the changing region being arranged between at least two electrically conductive regions,
deforming the changing region on the basis of a force, a pressure or the like,
measuring the electrical variable in the loaded state, and
determining the force, the pressure or the like using the measured electrical variable.

The method for producing a microelectromechanical sensor, in particular as described herein, comprises the steps of
applying a thin oxide layer to a first electrically conductive layer, preferably using thermal oxidation or chemical vapor deposition, in particular using atomic layer deposition,
applying a second electrically conductive layer to the thin oxide layer, preferably using chemical and/or physical vapor deposition, and
arranging the layers arranged above one another on a substrate in such a manner that at least some of the layers arranged above one another—first electrically conductive layer, oxide layer and second electrically conductive layer—can be deformed.

The microelectromechanical sensor defined in the description below, the method defined in the description below and the method for producing a microelectromechanical sensor defined in the description below have the advantage that a microelectromechanical sensor can be produced in a cost-effective manner, is simultaneously more insensitive to interference and can be used in a wider temperature range. In addition, the microelectromechanical sensor and the corresponding method have a higher degree of accuracy.

According to another preferred development of the disclosure, the changing region has a thickness of less than 25 nanometers, in particular less than 10 nanometers, preferably less than 5 nanometers, in the unloaded state. The advantage here is thus that the quantum-mechanical tunnel effect for electrons can be used particularly well to measure the pressure and force, that is to say the sensitivity of the microelectromechanical sensor is accordingly high with a simultaneously high degree of accuracy. If the thickness of the changing region is reduced on account of a force acting indirectly on it, the tunnel barrier becomes smaller and the likelihood of electrons tunneling through is increased; the tunnel current through the changing region increases exponentially, in particular.

According to another advantageous development of the disclosure, the changing region comprises silicon dioxide and/or silicon nitride. The advantage achieved here is thus that the microelectromechanical sensor can be provided with an electrically insulating layer in a simple and cost-effective manner.

According to another advantageous development of the disclosure, the measuring element comprises a plurality of electrically conductive regions and changing regions arranged alternately. The advantage here is thus that the sensitivity and accuracy of the microelectromechanical sensor are increased further if, for example, a plurality of the regions are arranged above one another in such a manner.

According to another advantageous development of the disclosure, the microelectromechanical sensor comprises a diaphragm having a respective measuring element on at least two, in particular four, adjacent sides. The advantage here is thus that the sensitivity and accuracy of the microelectromechanical sensor can be increased yet further; for example, the measured values of the respective measuring elements can be used to average a force or pressure measurement.

According to another advantageous development of the method, the force, the pressure or the like is determined using a monotonous, in particular exponential, profile of the electrical variable. The advantage here is thus that a particular force or a particular pressure or the like can be unambiguously associated with the electrical variable in a simple and reliable manner, with the result that it is possible to reliably determine the pressure, the force or the like.

BRIEF DESCRIPTION OF THE DRAWINGS

Exemplary embodiments of the disclosure are illustrated in the drawing and are explained in more detail in the following description. In the drawing:

FIG. 5 shows steps of a method for producing a microelectromechanical sensor according to the first embodiment of the present disclosure, and FIG. 6 shows steps of a method according to the first embodiment.

DETAILED DESCRIPTION

In the figures, identical reference symbols denote the same or functionally identical elements.

Figure 1:
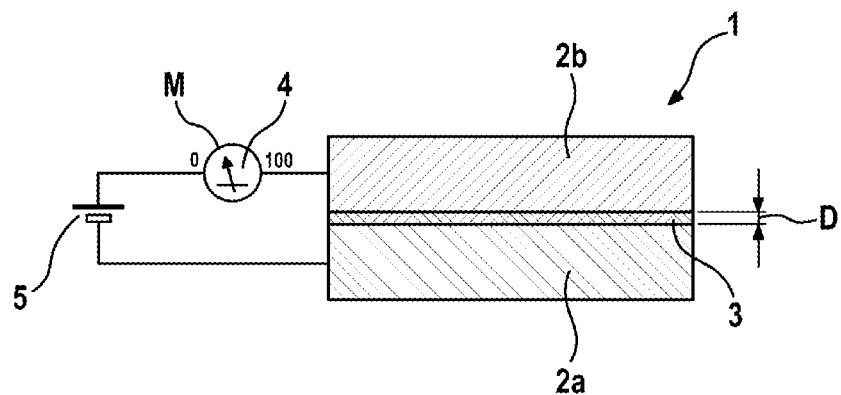
FIG. 1 shows a basic circuit diagram of a method of operation of a microelectromechanical sensor according to a first embodiment.
Figure 1:
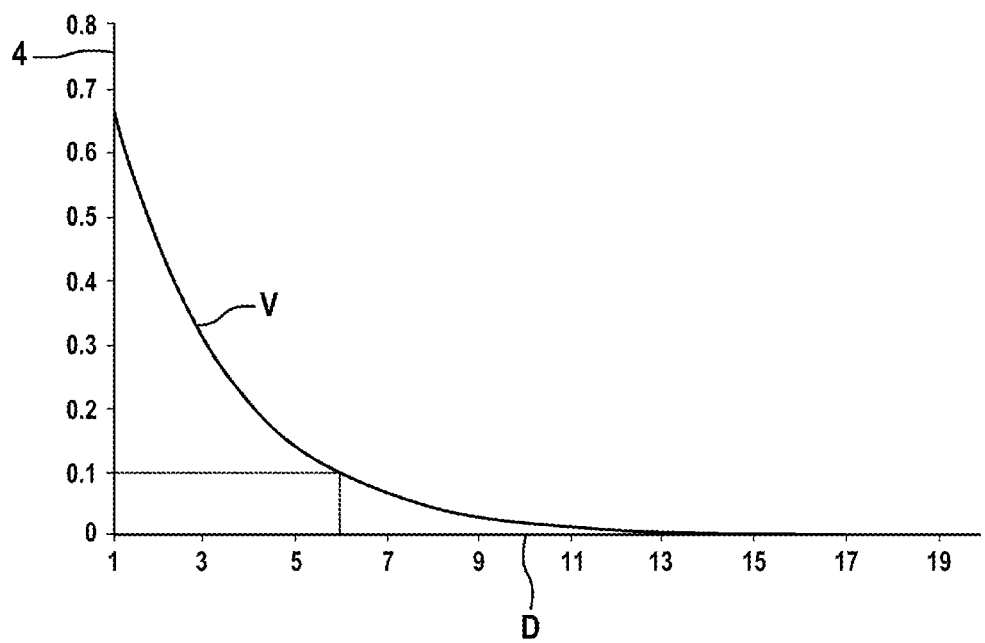

FIG. 1 shows a basic circuit diagram for the method of operation of a microelectromechanical sensor according to a first embodiment.

In FIG. 1, reference symbol 1 denotes a measuring element of a microelectromechanical sensor. The measuring element 1 comprises a lower electrically conductive region 2a and an upper electrically conductive region 2b with a substantially rectangular cross section. A changing region 3 which likewise substantially has a rectangular cross section is arranged between the two electrically conductive regions 2a, 2b. The thickness D of the changing region is measured in a vertical direction in this case according to FIG. 1. Furthermore, in FIG. 1a, the lower electrically conductive region 2a and the upper electrically conductive region 2b are connected to a voltage source 5 and to a current measuring device M for a tunnel current 4 through the electrically conductive regions 2a, 2b and the changing region 3. If the thickness D of the changing region 3 is now reduced, the tunnel current 4 flowing between the conductive regions 2a, 2b increases exponentially according to the profile V in FIG. 1b. In the diagram according to FIG. 1b, the tunnel current 4 is thus plotted against the thickness D of the changing region 3. In the profile, V is exponential in this case, and the scales on the abscissa and the ordinate are linear in this case. With a thickness D of only one nanometer, the tunnel current according to FIG. 1b has the magnitude 0.67, whereas it has the value 0.1 with a thickness D of 6 nanometers. In this case, the tunnel current 4 is provided with any desired unit.

Figure 2:
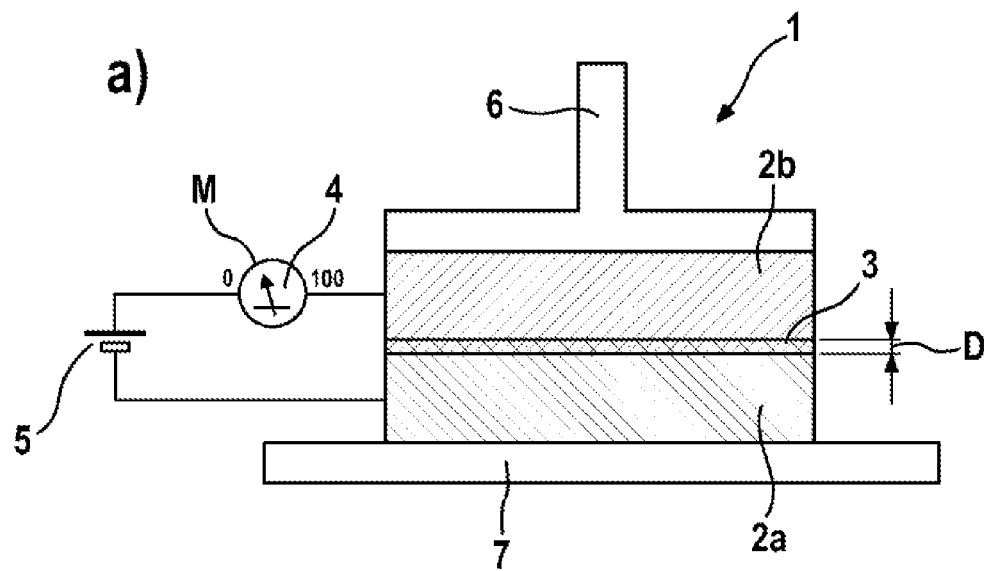
FIG. 2 shows a basic circuit diagram of a microelectromechanical sensor according to a second embodiment of the present disclosure.
Figure 2:
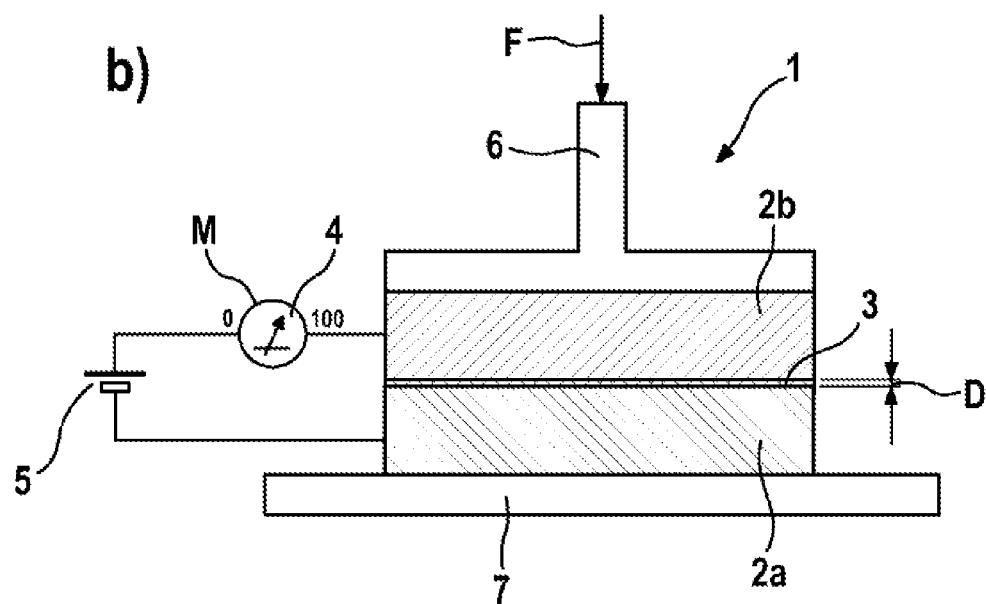

FIG. 2 shows a basic circuit diagram of a microelectromechanical sensor according to a second embodiment of the present disclosure. FIG. 2a shows a measuring element 1 of a microelectromechanical sensor; said element substantially corresponds to the structure of the measuring element 1 according to FIG. 1a. A substrate 7 on which the electrically conductive region 2a is arranged is also shown. A substantially T-shaped force stamp 6 is arranged on the electrically conductive region 2b. In FIG. 2a, a force is not applied to the force stamp 6.

If a force F now acts on the force stamp 6 from above, the thickness D of the changing region 3 is indirectly reduced thereby. On account of the reduced thickness D of the changing region 3, a larger tunnel current 4 can now flow through the changing region 3 between the electrically conductive regions 2a, 2b on account of the voltage applied to the electrically conductive regions 2a, 2b. The force F acting on the force stamp 6 can then be determined using the tunnel current 4.

Figure 3:
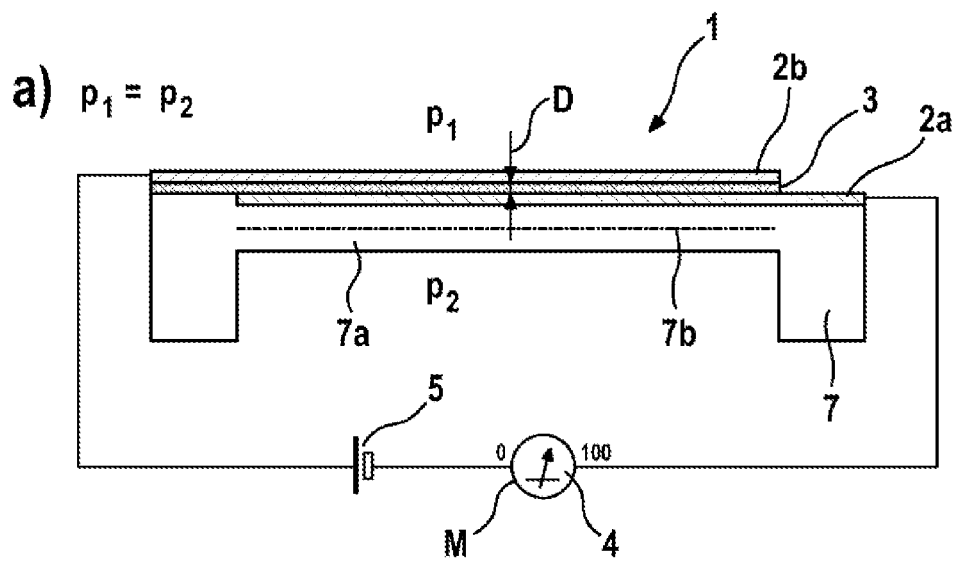
FIG. 3 shows a schematic illustration of a microelectromechanical sensor according to a third embodiment of the present disclosure.
Figure 3:
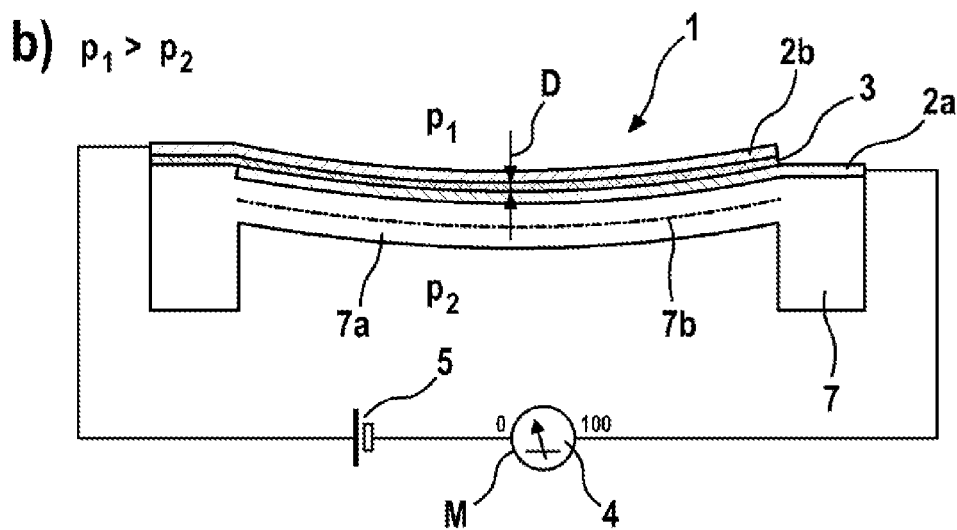

FIG. 3 shows a schematic illustration of a microelectromechanical sensor according to a third embodiment of the present disclosure. FIG. 3a shows a measuring element 1 of a microelectromechanical sensor. In this case, the structure of the measuring element 1 again substantially corresponds to the corresponding structure according to FIGS. 1 and 2. In contrast to FIG. 1a, the lower first electrically conductive region 2a is arranged with an offset to the right in the horizontal direction with respect to the changing region 3 and the second electrically conductive region 2b according to FIG. 3a. In addition, the first electrically conductive region 2a is connected to a substrate 7. The substrate 7 also has a bendable region 7a in which a neutral fiber 7b is arranged.

The changing region 3 is at least partially connected to the substrate 7 on its left-hand side, whereas the first electrically conductive region 2a is connected to the substrate 7 on the right-hand side. As described in the preceding FIGS. 1-2, the first electrically conductive region 2a and the second electrically conductive region 2b are connected to a voltage source 5 and to a measuring device M for the tunnel current 4.

In FIG. 3a, a pressure $p_1$ above the electrically conductive region 2b is equal to a pressure $p_2$ below the bendable region 7a. The bendable region 7a may be in the form of a diaphragm, for example. The electrically conductive regions 2a, 2b and the changing region 3 are arranged horizontally and parallel to one another. The measuring device M for the tunnel current 4 measures a particular magnitude of a tunnel current 4 flowing through the electrically conductive regions 2a, 2b and through the changing region 3.

In FIG. 3b, the pressure $p_1$ above the electrically conductive region 2b is now greater than the pressure $p_2$ below the bendable region 7a of the substrate 7 and therefore also below the electrically conductive region 2a. The bendable region 7a, the neutral fiber 7b, the electrically conductive regions 2a, 2b and the changing region 3 are accordingly bent downward according to FIG. 3b. As a result of the higher pressure $p_1$ on the top side of the electrically conductive region 2b, the electrically conductive regions 2a, 2b and the changing region 3 are compressed in the substantially horizontal plane of the diaphragm or the bendable region 7a. On account of this compression or this transverse contraction, the electrically conductive regions 2a, 2b and the changing region 3 are expanded in the perpendicular direction thereto. As a result, the thickness D of the changing region 3 is increased and the tunnel current 4 consequently decreases. The pressure or the pressure difference can be determined in this manner.

Figure 4:
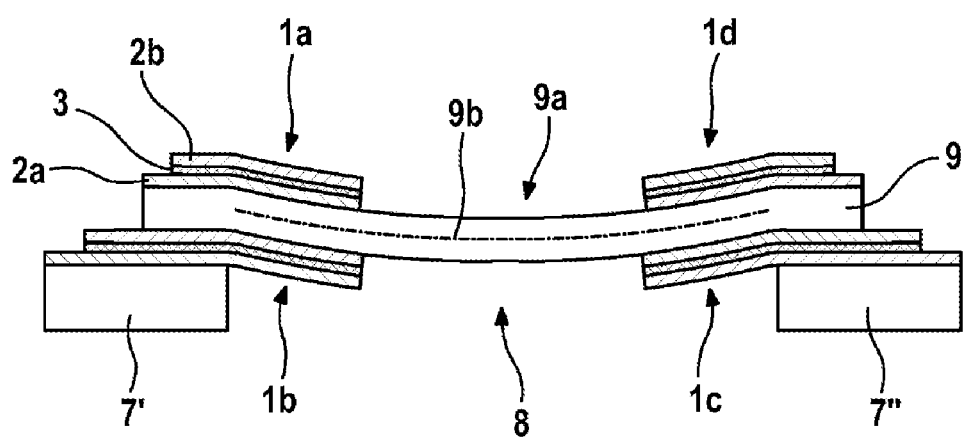
FIG. 4 shows a schematic illustration of a microelectromechanical sensor according to a fourth embodiment of the present disclosure.
Figure 4:
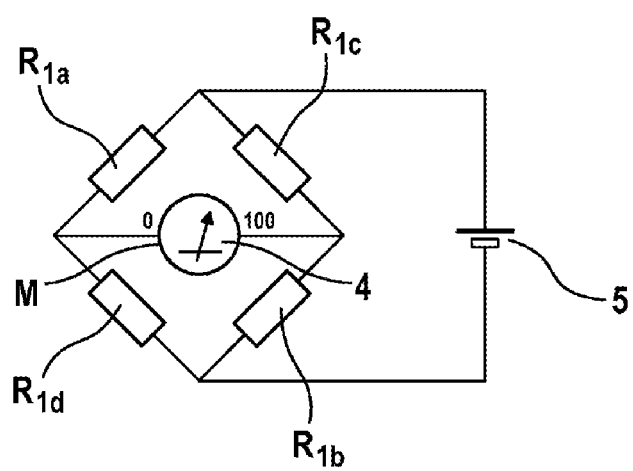

FIG. 4 shows a schematic illustration of a microelectromechanical sensor according to a fourth embodiment of the present disclosure. In FIG. 4a, the microelectromechanical sensor has four measuring elements 1a, 1b, 1c, 1d. The structure of each of the measuring elements 1a, 1b, 1c, 1d corresponds to that of the measuring element 1 in FIG. 1. The arrangement of the four measuring elements 1a, 1b, 1c, 1d is as follows: FIG. 4a shows a part 7', 7" of a substrate 7 on the left-hand and right-hand sides, respectively. An intermediate space 8 is arranged between the two parts 7', 7" of the substrate 7. The measuring element 1b is now arranged on the left-hand part of the substrate 7', the first electrically conductive region 2a being arranged on the left-hand part 7' of the substrate. The measuring element 1c is accordingly arranged on the right-hand part 7" of the substrate 7. In this case, the respective lower conductive electrical regions 2a of the measuring elements 1b, 1c are larger, with respect to their horizontal extent, than the respective changing regions 3 and the electrically conductive regions 2b. In this case, the measuring elements 1b, 1c partially extend into the intermediate space 8. A diaphragm 9 which is connected to the electrically conductive regions 2b of the measuring elements 1b, 1c is arranged on the two measuring elements 1b, 1c. In this case, the diaphragm 9 has a bendable region 9a and comprises a neutral fiber 9b in its interior. In this case, the diaphragm 9 extends completely from the left to the right, that is to say from the left-hand part 7' to the right-hand part 7" of the substrate 7. The two further measuring elements 1a, 1d are now arranged on the respective left-hand and right-hand end regions of the diaphragm 9 on the top side of the latter. The first electrically conductive regions 2a of the measuring elements 1a, 1d are connected to the diaphragm 9 in this case. In this case, the measuring elements 1a, 1d again partially extend into the intermediate space 8 between the two parts 7', 7" of the substrate 7. Overall, the horizontal extent of the measuring elements 1a, 1d is shorter in each case than the horizontal extent of the measuring elements 1b, 1c. The diaphragm 9 is likewise arranged in such a manner that it is only partially connected to the second electrically conductive regions 2b of the measuring elements 1b, 1c.

FIG. 4a now shows the corresponding pressure situation according to FIG. 3b, that is to say the pressure above the diaphragm 9 is greater than the pressure below the diaphragm 9. The diaphragm 9 according to FIG. 4a is thus pushed downward by the pressure difference. If correspondingly applied respective voltages 5 are applied to the respective measuring elements 1a, ab, 1c, 1d, as shown in FIG. 1, a decrease in the tunnel current 4 is measured in the measuring elements 1a, 1d, whereas the tunnel current 4 increases in the measuring elements 1b, 1c, compared in each case with the tunnel currents 4 flowing through the measuring elements 1a, 1b, 1c, 1d when the diaphragm 9 is not deflected or when there is no pressure difference between the top side and underside of the diaphragm 9.

FIG. 4b shows a connection of the measuring elements 1a, 1b, 1c, 1d in the form of a Wheatstone bridge. In this case, the resistors $R_{1a}$, $R_{1b}$, $R_{1c}$, $R_{1d}$ shown there correspond to the electrical resistances of the measuring elements 1a, 1b, 1c, 1d. If a voltage 5 is now applied to the correspondingly connected resistors $R_{1a}$, $R_{1b}$, $R_{1c}$, $R_{1d}$ according to the principle of the Wheatstone bridge, the measuring device M for the tunnel current 4 can detect a monotonous increase in the tunnel current 4 with increasing diaphragm deflection 9. The accuracy of the measurement of the pressure difference is increased in this manner by the deflection of the diaphragm 9 since this enables differential evaluation by the four measuring elements 1a, 1b, 1c, 1d.

FIG. 5 shows steps of a method for producing a microelectromechanical sensor according to the first embodiment of the present disclosure. In this case, according to FIG. 5a, the first electrical region 2a is formed by a silicon wafer 2a on which a native oxide layer 10 is arranged, and this native oxide layer 10 is now removed in the next step according to FIG. 5b, for example by means of hydrofluoric acid, with the result that only the silicon wafer 2a remains according to FIG. 5b. According to FIG. 5c, an ultra-thin layer of silicon dioxide is applied (step $T_1$), as the changing region 3, to this silicon wafer 2a, for example by means of thermal oxidation. In a further step $T_2$ according to FIG. 5d, a further electrically conductive layer 2b of silicon is now applied, for example by means of a chemical vapor deposition process of a silicon-containing base material, and the layer stack 2a, 3, 2b is applied to a substrate 7 in a further step $T_3$.

FIG. 6 shows steps of a method according to the first embodiment. FIG. 6 shows a flowchart of a method for measuring a pressure, a force or the like: in a first step $S_1$, an electrical variable is measured. In a further step $S_2$, the changing region is deformed on account of a force, a pressure or the like. In a third step $S_3$, the electrical variable is measured in the loaded state. In a further step $S_4$, the force, the pressure or the like is determined using the measured electrical variable.

Although the present disclosure was described above using preferred exemplary embodiments, it is not restricted thereto, but rather can be modified in various ways. For example, not only silicon but also silicon carbide, for example, is possible as the substrate material.

The invention claimed is:

1. A microelectromechanical sensor for measuring a force, a pressure or the like, comprising:
    a substrate; and
    four measuring elements, each measuring element including:
        at least two electrically conductive regions, at least one of the electrically conductive regions of a first measuring element of the four measuring elements being at least partially connected to the substrate; and
        at least one changing region at least partially arranged between the electrically conductive regions, the changing region being substantially electrically insulating in an unloaded state and being substantially electrically conductive in a loaded state, wherein the four measuring elements are connected in the form of a Wheatstone bridge.

2. The microelectromechanical sensor as claimed in claim 1, wherein the changing region has a thickness D of less than 25 nanometers in the unloaded state.

3. The microelectromechanical sensor as claimed in claim 1, wherein the changing region includes at least one of silicon dioxide and silicon nitride.

4. The microelectromechanical sensor as claimed in claim 1, wherein the measuring element includes a plurality of electrically conductive regions and changing regions arranged alternately.

5. The microelectromechanical sensor as claimed in claim 1, further comprising a diaphragm on which the first measuring element and a second measuring element of the four measuring elements are arranged on a bottom side of the diaphragm, and on which a third measuring element of the four measuring elements and a fourth measuring element of the four measuring elements are arranged on a top side of the diaphragm.

6. A method for producing a microelectromechanical sensor, comprising:
    forming four measuring elements, each measuring element being formed by:
        applying a thin oxide layer to a first electrically conductive layer;
        applying a second electrically conductive layer to the thin oxide layer; and
        arranging the first electrically conductive layer, the thin oxide layer, and the second electrically conductive layer on a substrate such that at least some of the first electrically conductive layer, the oxide layer, and the second electrically conductive layer are deformable; and connecting the four measuring elements in the form of a Wheatstone bridge.

* * * * *